(12) United States Patent
Zentai et al.

(10) Patent No.: US 7,291,842 B2
(45) Date of Patent: Nov. 6, 2007

(54) PHOTOCONDUCTOR IMAGERS WITH SANDWICH STRUCTURE

(75) Inventors: George Zentai, Mountain View, CA (US); Larry D. Partain, Los Gatos, CA (US)

(73) Assignee: Varian Medical Systems Technologies, Inc., Palo Alto, CA (US)

( * ) Notice: Subject to any disclaimer, the term of this patent is extended or adjusted under 35 U.S.C. 154(b) by 163 days.

(21) Appl. No.: 11/153,017

(22) Filed: Jun. 14, 2005

(65) Prior Publication Data

US 2006/0278832 A1 Dec. 14, 2006

(51) Int. Cl.
*G01T 1/24* (2006.01)
(52) U.S. Cl. .............................. 250/370.09
(58) Field of Classification Search ......... 250/370.09, 250/370.14
See application file for complete search history.

(56) References Cited

U.S. PATENT DOCUMENTS

| | | | | |
|---|---|---|---|---|
| 5,515,604 A | * | 5/1996 | Horine et al. ............ | 29/830 |
| 5,635,718 A | * | 6/1997 | DePuydt et al. .......... | 250/370.09 |
| 5,842,273 A | * | 12/1998 | Schar ........................ | 29/830 |
| 6,342,700 B1 | * | 1/2002 | Izumi et al. ............. | 250/370.13 |
| 6,982,424 B2 | * | 1/2006 | Vafi et al. ................. | 250/370.11 |
| 6,982,425 B1 | * | 1/2006 | Rougeot et al. ......... | 250/370.14 |
| 7,148,486 B2 | * | 12/2006 | Heismann et al. ........ | 250/370.09 |
| 7,170,062 B2 | * | 1/2007 | Vuorela ..................... | 250/370.09 |
| 2003/0155516 A1 | * | 8/2003 | Spartiotis et al. ........ | 250/370.09 |
| 2005/0066521 A1 | * | 3/2005 | Cheng et al. ............. | 29/829 |
| 2005/0095896 A1 | * | 5/2005 | Tutt ............................. | 439/342 |

OTHER PUBLICATIONS

Satoshi Tokuda, et al., "Experimental evaluation of a novel CdZnTe flat-panel X-ray detector for digital radiography and fluoroscopy," Proceedings of SPIE, vol. 4320 (Jun. 2001) pp. 140-147.*
Tokuda, Satoshi et al., "Experimental evaluation of a novel CdZnTe flat-panel X-ray detector for digital radiography and fluoroscopy", Proc. SPIE-MI 2002 vol. 4682, p. 30, 8 pp.
Shin-Etsu Polymer Co., Ltd./Connector department data sheet, "Anisotrophic Conductive Sheet", 2 pp.
Anistrophic Conductive Sheet—AF Type [online], [retrieved on Apr. 14, 2005], Retrieved from Shin-Etsu Polymer Co, Ltd. Website, http://www.shinpoly.co.jp/business/connector/products_e/af.html?typeani, pp. 1-2.

* cited by examiner

*Primary Examiner*—Constantine Hannaher
(74) *Attorney, Agent, or Firm*—Foley & Lardner LLP

(57) ABSTRACT

An image acquisition device 30 includes a photoconductor 48 to convert an electromagnetic radiation into electrical signals, a first layer 36 or 37 coupled to the photoconductor 48. The first layer 36 or 37 includes an insulator 54 and a plurality of conductors 56 or 57 embedded in the insulator 54 to conduct the electrical signals. A method of making an image acquisition device 30 includes the step of sandwiching a layer including an insulator and a plurality of conductors embedded in the insulator between a photoconductor layer and an electrode.

35 Claims, 5 Drawing Sheets

PHOTOCONDUCTOR IMAGERS WITH SANDWICH STRUCTURE

FIELD OF THE INVENTION

This invention relates generally to photoconductor imagers, and in particular, to photoconductor imagers having sandwich structure and methods for making the same.

BACKGROUND

X-ray imagers using thin film transistors (TFTs) have been developed for X-ray imaging systems, which are widely used in various fields of life and industry. FIG. 1 illustrates a conventional X-ray imager 10, which comprises a plurality of amorphous or polycrystalline TFTs 12 and capacitors 14 formed on a substrate 16. A pixellated electrode 18 is deposited atop the TFT and capacitor array. Each TFT 12 and capacitor 14 is coupled to one pixel 18. The TFTs 12 have gate lines 20 to address the matrix lines and data lines to read out the charge accumulated at each capacitor 14. Directly deposited atop the pixellated electrode 18 is a photoconductor 22, on which a conductive electrode 24 is deposited.

Photoconductor 22 converts X-ray photons into electrical signals. The electron-hole pairs produced by photoconductor 22 are in proportion to the strength of external X-rays. Depending on the voltage polarity applied to conductive electrodes 18 and 24, either electrons or holes are gathered by the pixellated electrode 18 as electric charge. The gathered electric charge is accumulated and stored in capacitors 14. The charge in capacitors 14 is then selectively transferred through TFTs 12 to an external image display device that forms an X-ray image.

Since photoconductor 22 is traditionally directly deposited onto the pixellated electrode 18 and TFT 12 and capacitor 14 array, the temperature tolerance of the TFTs and capacitors limits the maximum temperature of deposition of the photoconductive material 22. The most widely used amorphous silicon (a-Si) TFT array for imaging can withstand only 200 to 250° C. However, some good photoconductor materials such as Cadmium Zinc Telluride (CZT) require a much higher deposition temperature (e.g., more than 600° C.) to achieve good quality polycrystalline photosensitive layer.

It has been proposed that a photoconductive material is deposited on a separate substrate, which is then bonded onto a TFT array. FIG. 2 schematically shows a prior art method in which metal indium (In) balls 26 are used in the bonding. As shown in FIG. 2, an indium ball 26 is applied onto each of a plurality of pixels 18. The TFT 12 and capacitor 14 array is then heated to melt the indium balls 26. The substrate 25 deposited with a photoconductive layer 22 is then pressed against the TFT 12 and capacitor 14 array to provide bonding between the photoconductor layer 22 and the pixellated electrode 18. One limitation of this method is that it requires millions of indium balls precisely aligned pixel by pixel on a large area device (e.g., 17"×17"), which is difficult to achieve. If the surface of the photoconductor layer is not sufficiently flat and smooth, for example, to a few microns, or the indium balls are slightly misaligned as shown in FIG. 2 (the middle ball), then either open circuits or shorts between neighboring pixels are resulted after the bonding. Another limitation is that some photoconductive materials cannot withstand the high temperature of the bonding process and/or are incompatible with indium material.

An alternative method is shown in FIG. 3 in which a conductive resin 28 is used to bond a photoconductor layer with a TFT array. One problem of this method is that the conductive resin 28 also conducts sideways or horizontally. Sideway conduction results in signal sharing between adjacent pixels, and thus degrading the spatial resolution and pixel-to-pixel homogeneity.

Accordingly, there is a need for improved X-ray imagers that eliminate these and other problems and/or limitations of prior art X-ray imager.

SUMMARY OF THE INVENTION

A photoconductor assembly is provided. The photoconductor assembly includes a photoconductor adapted to convert an electromagnetic radiation into electrical signals and a first layer coupled to the photoconductor. The first layer includes an insulator and a plurality of conductors embedded in the insulator adapted to conduct the electrical signals. An image acquisition device and a method of making an image acquisition device are also provided.

BRIEF DESCRIPTION OF THE DRAWINGS

These and various other features and advantages of the present invention will become better understood upon reading of the following detailed description in conjunction with the accompanying drawings and the appended claims provided below, where:

DETAILED DESCRIPTION OF THE INVENTION

Figure 1:
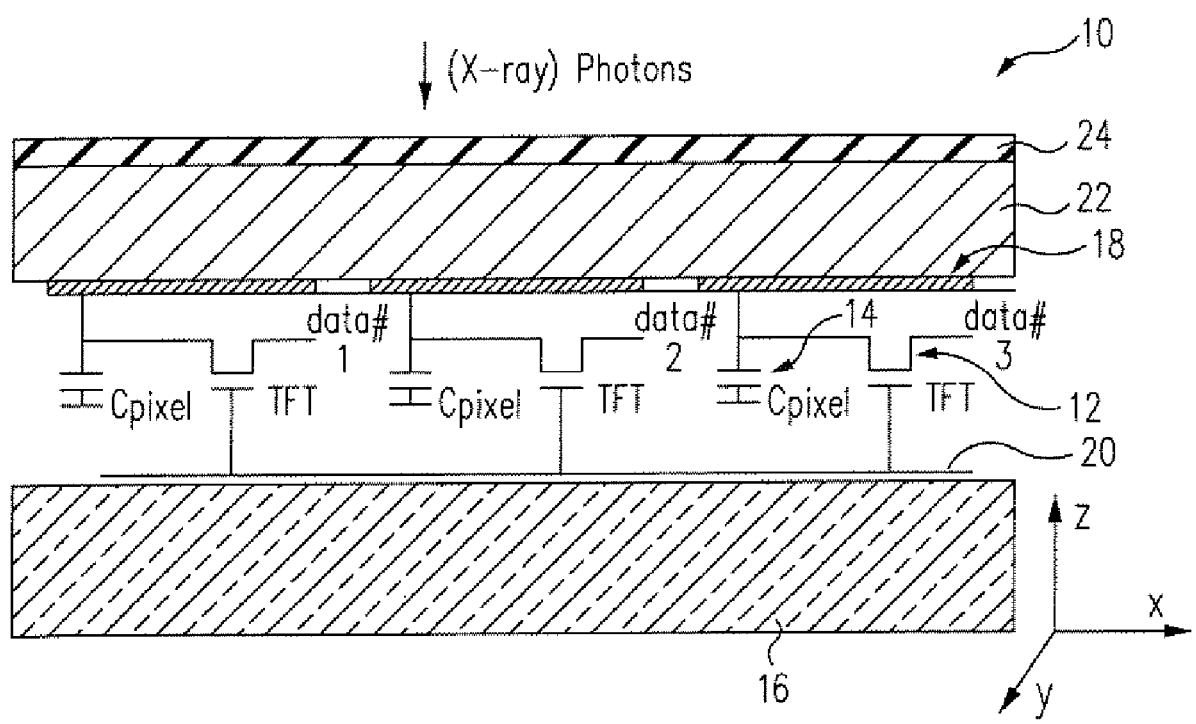
FIG. 1 is a schematic cross-sectional view of a conventional X-ray imager having a detector array.
Figure 2:
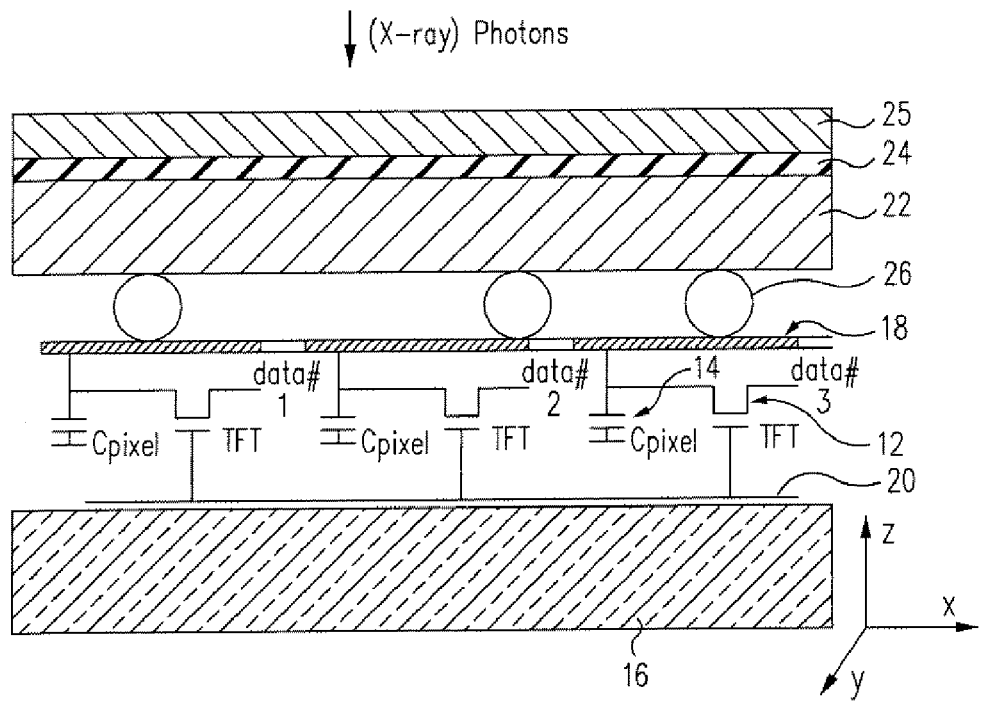
FIG. 2 is a schematic cross-sectional view of a conventional X-ray imager using indium balls to bond a photoconductor layer with a detector.
Figure 3:
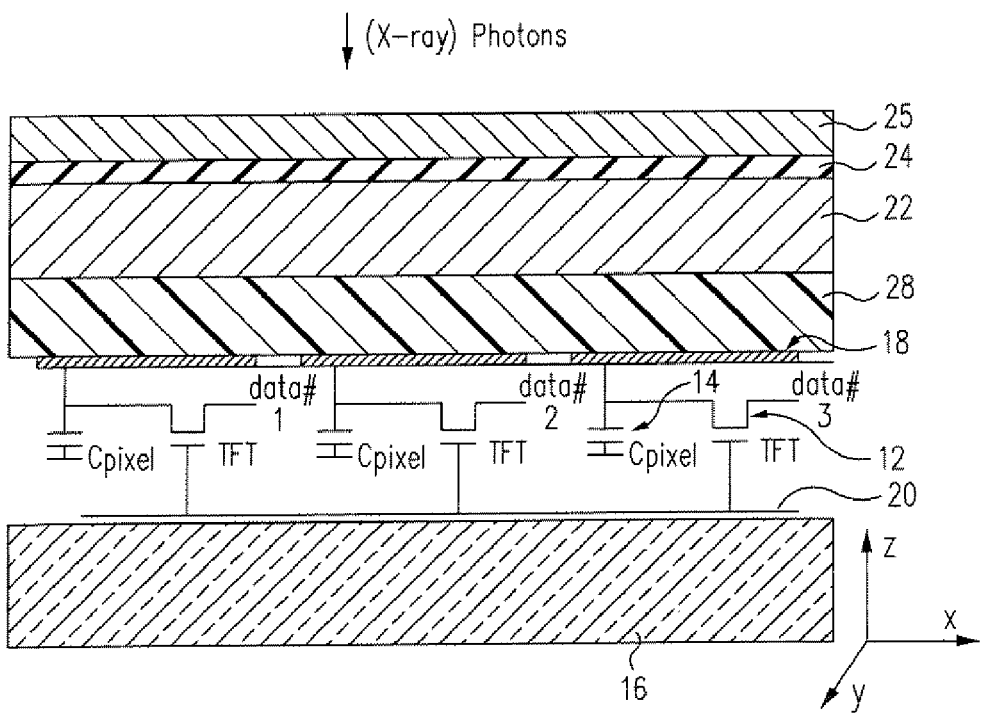
FIG. 3 is a schematic cross-sectional view of a conventional X-ray imager using a resin layer to bond a photoconductor layer with a detector array.

Various embodiments of the present invention are described hereinafter with reference to the figures. It should be noted that the figures are not drawn to scale and elements of similar structures or functions are represented by like reference numerals throughout the figures. It should also be noted that the figures are only intended to facilitate the description of specific embodiments of the invention. They are not intended as an exhaustive description of the invention or as a limitation on the scope of the invention. In addition, an aspect described in conjunction with a particular embodiment of the present invention is not necessarily limited to that embodiment and can be practiced in any other embodiments of the present invention. For instance, in the following description, the present invention is described with embodiments of an X-ray acquisition device including a TFT array. It will be appreciated that the claimed invention can be used not only for X-ray detectors, but also for any other type of photon detectors such as infrared ray, visible ray, and ultraviolet ray detectors. The claimed invention can also be used for liquid crystal displays. The claimed invention applies to not only TFT arrays, but also other type of matrix structures such as organic transistors, coupled charge devices (CCDs), and/or switching diodes.

Figure 4:
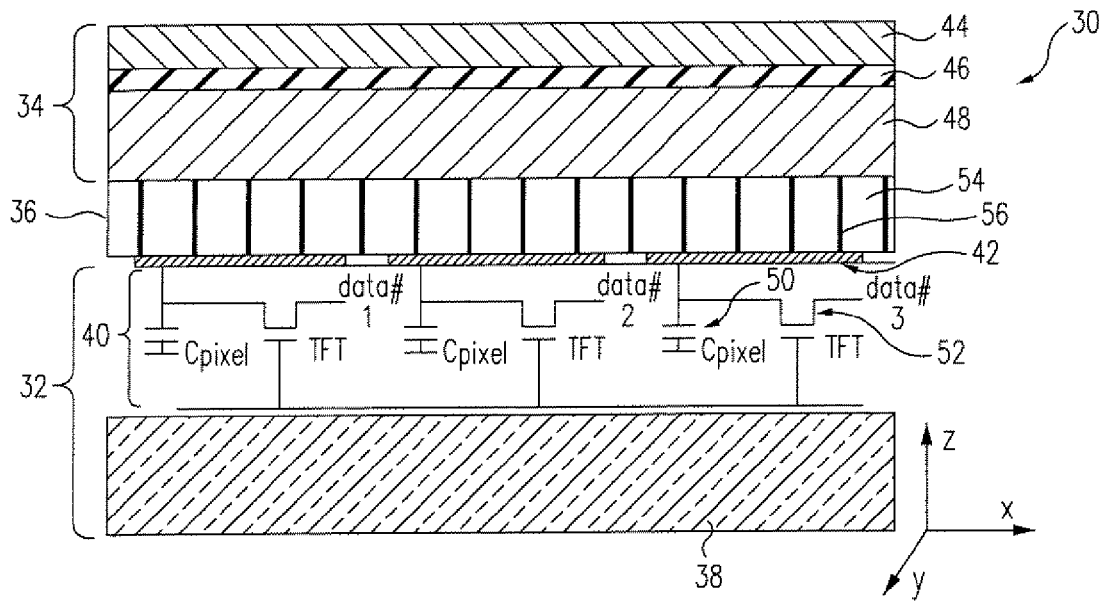
FIG. 4 is a schematic cross-sectional view of a photoconductor imager in accordance with an embodiment of the present invention.

An X-ray acquisition device 30 in accordance with an embodiment of the present invention is illustrated in FIG. 4. The x-ray acquisition device 30 includes a first panel 32, a second panel 34, and an interconnecting or first layer 36 between the first and second panels 32 and 34. The first panel 32 includes a first substrate 38, a detector array 40 formed atop first substrate 38, and a first electrode 42 atop detector array 40. The second panel 34 includes a second substrate 44, a second electrode 46, and a photoconductor 48. In some embodiments, interconnecting layer 36 is sandwiched between first electrode 42 and photoconductor 48.

The first and second substrates 38 and 44 can be made from a wide variety of materials. They can be elemental and/or compound substrates. They can be flexible or rigid. Materials suitable for the first and second substrates 38 and 44 include, but are not limited to silicon, quartz, ceramics, glass, plastics such as Kapton, aluminum, copper, tungsten, chrome, gallium arsenide, metals and metal oxides and/or nitrides.

In an embodiment of the present invention, the second substrate 44 is made from a material that can withstand high deposition temperatures of photoconductor materials such as up to 650° C. or that can resist corrosive deposition environments or that can accommodate other disruptive requirements, such as surface smoothness (e.g., surface roughness of less than one micron). Examples of such materials include but are not limited to silicon, quartz, ceramics, glass, plastics such as Kapton, aluminum, copper, tungsten, chrome, steel, stainless steel, chrome plated steel, and temperature and/or corrosive resistant polymers. In such embodiment, photoconductive materials that require high deposition temperatures or other disruptive deposition conditions can be separately deposited onto the second substrate 44 without limitations of the detector array 40 formed on the first substrate 38. In some embodiments, the second substrate 44 can be made of a conductive material so that it also functions as an electrode. In such embodiment, photoconductor 48 can be directly deposited on the second substrate 44.

Detector array 40 is formed on the first substrate 38. Detector array 40 includes a plurality of detector elements configured to generate electric signals in response to the charge collected on first electrode 42 described below. Each detector element may have a storage capacitor 50 to store the charge generated by the X-rays and collected by first electrode 42. Each detector element may also include a switching element such as a thin film transistor (TFT) 52 to access the collected charges by readout electronics. The TFTs 52 and capacitors 50 can be formed on first substrate 38 by any methods known in the art. While the structural components of TFTs 52 and capacitors 50 are not shown in detail in FIG. 4 to avoid obscuring illustration of various embodiments of the invention, an a-Si TFT generally includes spaced apart source and drain electrodes on an amorphous silicon layer, and a gate electrode on a dielectric layer. The TFTs 52 can be amorphous silicon (a-Si) TFT, or crystalline or polycrystalline silicon TFT. It should be pointed out that the TFTs 52 are shown in FIG. 4 and described herein for illustrating purpose and not intended to limit the present invention in any way. The detector element may include other switching elements such as organic transistors, coupled charge devices (CCDs), and/or switching diodes. Optionally the detector elements can contain further components for signal or charge buffering and amplification. The detector element may also include polycrystalline silicon or organic active elements. Each detector element forms a pixel of the X-ray image generated using the detector array. The detector array 40 also includes a pixel access circuit (not shown) coupled to detector elements. The pixel access circuit accesses the detector elements and reads the electric signals from the detectors. The process of accessing detector elements and reading electric signals therefrom is known to those skilled in the art.

The first and second electrodes 42 and 46 can be made from a wide variety of materials, such as silver, chromium, aluminum, gold, nickel, vanadium, zinc, palladium, platinum, carbon, etc, and alloys of these materials. Semiconductive layers such as cuprous iodide, indium tin oxide, cadmium stannate, silicon, germanium, amorphous silicon and doped versions of these semiconductors may also be used. In general, materials that are capable of conducting electrical current are suitable for construction of the electrodes. Each electrode may also have a variety of configurations. Each electrode may have a variety of shapes, and is not limited to the planar configuration shown in the illustrated embodiment.

First electrode 42 is formed atop detector array 40. In a specific embodiment, first electrode 42 is pixellated and includes a plurality of pixel units. Preferably, the pixel units are aligned with the detector elements in detector array 40. In one embodiment, each pixel unit is aligned with one detector element in the detector array 40. In such embodiment, the size of the pixel units is about the same as that of the detector element. The theoretical maximum spatial resolution of the X-ray images generated using the X-ray image acquisition device is determined by the pixel size of the detector element in the detector array. In an embodiment, the maximum spatial resolution of the X-ray images is limited by the size of first electrode.

Second electrode 46 is formed on second substrate 44. Second electrode 46 can be pixellated or non-pixellated. In some embodiments, second substrate 46 is made of a conductive material such as a metal so that second substrate also functions as a second electrode.

Photoconductor 48 is made from a material that converts X-ray photons into electrical signals. In an embodiment, photoconductor 48 is capable of absorbing X-ray radiation at various energy levels. This may be achieved by selecting a suitable material and an appropriate thickness for the conversion photoconductor. In one embodiment, photoconductor 48 is made from a material that comprises a heavy element. Generally, materials having heavy element(s) are preferred for construction of the photoconductor because they are able to better absorb X-ray radiation, and therefore, provide a high X-ray radiation absorption efficiency. As used in this specification, the term "heavy element" refers to element that has an atomic number (Z) greater than 40. Examples of material that can be used include Mercuric Iodide ($HgI_2$), Lead Iodide ($PbI_2$), Bismuth Iodide ($BiI_3$), Cesium Iodide (CsI), Cadmium Zinc Telluride (CdZnTe), or equivalent thereof. In another embodiment, relatively lighter material (i.e., material that contains an element having an atomic number less than 40), such as Amorphous Selenium (a-Se), may also be used. Other conductive materials known in the art may also be used. Photoconductor 48 may be a single or poly-crystalline layer.

Generally, the thicker the photoconductor, the more X-ray radiation it can absorb. In an embodiment, photoconductor 48 has an optimum thickness depending on X-ray absorption efficiency, image resolution, light collection efficiency, the material(s) used for construction of the photoconductor, and other parameters of the X-ray imaging system design. Generally, the heavier the elements within the material used for construction of the photoconductor, the thinner the thickness of the photoconductor is required to achieve a given absorption efficiency. Photoconductor 48 preferably has a thickness configured for sufficiently absorbing X-ray radiation at a high energy level. As used in this specification, "high energy" is generally those energies of 160 keV or greater, and more typically 1 MeV or greater, and "low energy" is generally those energies below the high energy range, and more typically below 160 keV. In one embodiment, photoconductor 48 has a thickness greater than 1.0 millimeter. Various photoconductors are described in U.S. patent application Ser. No. 10/439,350, entitled "Multi Energy X-Ray Imager" and filed on May 15, 2003, the entire disclosure of which is incorporated herein by reference.

Referring to FIG. 4, interconnecting layer 36 is sandwiched between first panel 32 and second panel 34. In some embodiments, interconnecting layer 36 is sandwiched between photoconductor 48 and first electrode 42. Interconnecting layer 36 provides good electrical conduction in vertical direction (the z-axis) and minimizes conduction in horizontal directions (the x- and y-axes). Interconnecting layer 36 comprises an insulator 54 and a plurality of conductors 56 embedded in insulator 54 for transporting electrical signals generated in photoconductor 48.

Figure 5:
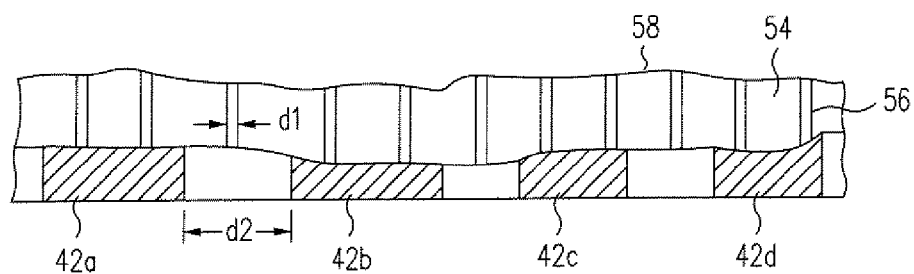
FIG. 5 is an enlarged partial cross-sectional view illustrating an interconnecting layer coupled to a photoconductor and an electrode in accordance with an embodiment of the present invention.

Insulator 54 can be made of any non-conducting materials. In some embodiments, insulator 54 is formed of non-conducting material that is flexible, or capable of being bent or flexed when compressed. A flexible material body can provide good contact between interconnecting layer 36 and photoconductor 48 and/or first electrode 42. As shown in FIG. 5, the surface 58 of photoconductor 48 is often time not perfectly smooth. Pixellated electrode 42 may not be even (e.g., 42a is thicker than 42b). Pixellated electrode 42 may be slightly bent (42c) or bowing (42d). A flexible interconnecting layer, when compressed, can conform to the rough surface and/or smooth any small imperfections of the photoconductor 48 and/or pixellated electrode 42 to provide good contact.

In some embodiments, insulator 54 can be made of chemically stable materials. A chemically stable insulator can function as a protection layer for photoconductor 48 and/or pixellated electrode 42. It is known that some photoconductors and electrodes are chemically reactive and in the prior art, a protection layer is often used to prevent corrosion or reaction between the photoconductor and electrode. The use of chemically stable insulator can eliminate the need of additional protection layer as used in the prior art. By way of example, the insulator can be silicone rubbers.

A plurality of conductors 56 are embedded in the insulator 54. In general, any materials that are capable of conducting electrical current can be used for construction of conductors 56. Exemplary materials suitable for conductors 56 include conductive carbon, metals such as nickel, copper, chrome or palladium coated iron, gold, and organic conductors. In a specific embodiment, conductors 56 are made of conductive carbon fibers.

Figure 6A:
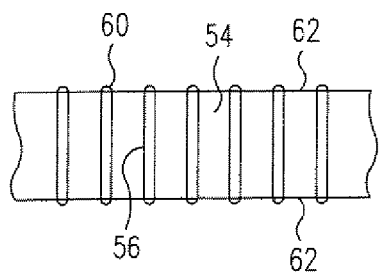
FIG. 6A is a schematic cross-sectional view illustrating an interconnecting layer in accordance with an embodiment of the present invention.

In some embodiments as shown in FIG. 4, conductors 56 are in the form of elongated conductive lines spaced apart in insulator 54. As shown in FIG. 6A, the end portions 60 of conductive lines 56 extend through the surfaces 62 of insulator 54 to provide points of contact. While conductive lines 56 are shown substantially perpendicular to photoconductor 48 and pixellated electrode 36, other configurations such as slant lines with angles are possible and anticipated by the present invention.

Figure 6B:
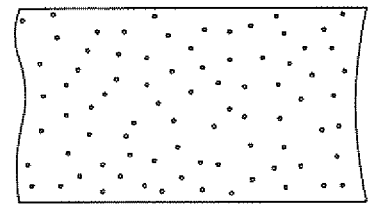
FIG. 6B is a schematic top view illustrating an interconnecting layer referred to in FIG. 6A in accordance with an embodiment of the present invention.

Preferably, conductive lines 56 are substantially homogeneously dispersed in insulator 54 as shown in FIG. 6B. In some embodiments, the number or the density of conductive lines 56 in insulator 54 is selected such that at least one or more conductive lines 56 are connected to each pixel 42. This ensures electrical contact of each pixel 42 with photoconductor 48 through the at least one or more conductive lines 56. By way of example, each pixel 42 may contact 1 to 10 conductive lines 56.

In some embodiments, the diameter ($d_1$) of conductive lines 56 is selected such that it is equal or smaller than the gap or distance ($d_2$) between two adjacent pixels 42. This can eliminate an undesirable situation where one conductive line contacts two adjacent pixels, which results in electric shorts. By way of example, the diameter $d_1$ of the conductive lines can be in the range from 3 to 20 microns for pixels having dimensions of 20 to 500 microns.

Figure 7:
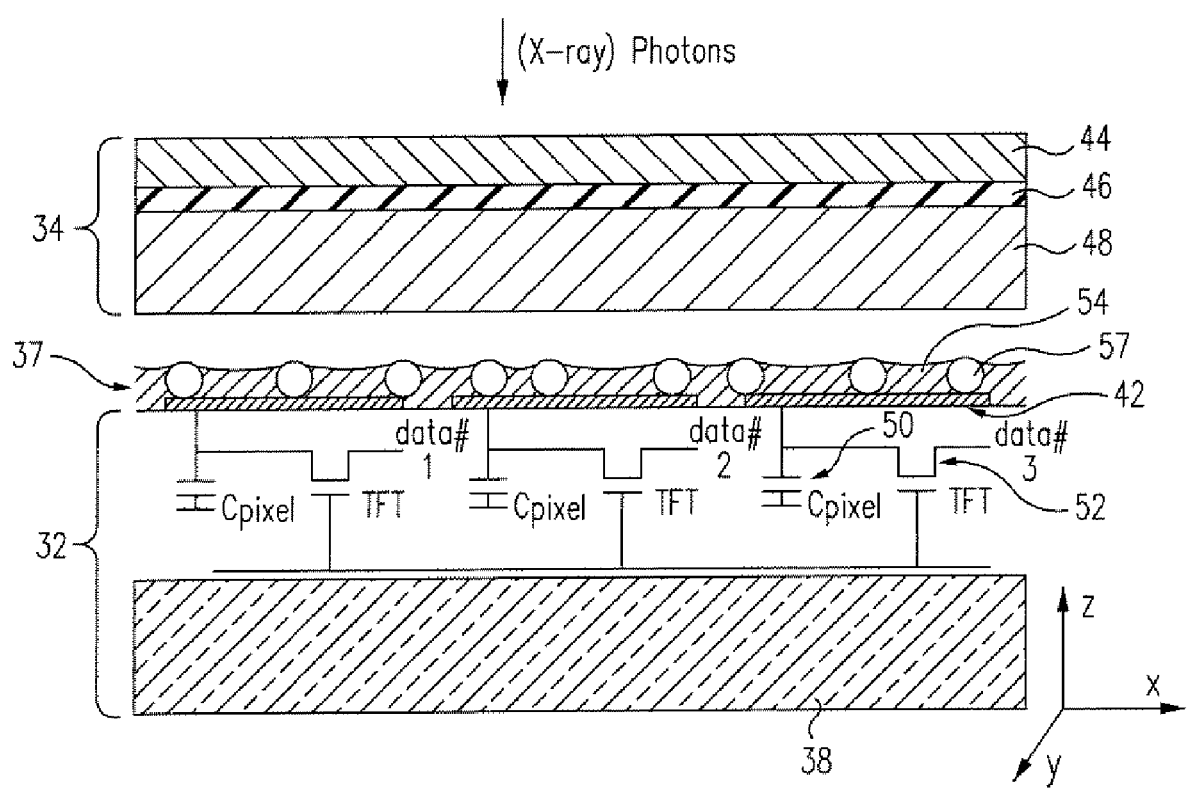
FIG. 7 is a schematic cross-sectional view of a photoconductor imager in accordance with another embodiment of the present invention.

Referring to FIG. 7, another embodiment of interconnecting layer 37 is shown. To describe the invention with greater clarity, FIG. 7 shows the first and second panels 32 and 34 before they are coupled to each other. Interconnecting layer 37 includes an insulator 54 and a plurality of conductors in the form of conductive particles 57 embedded in the insulator 54. For illustration purposes, the conductive particles 57 are shown in the form of spheres or balls in FIG. 7. Other non-spherical particles are possible and anticipated by the present invention.

The conductive particles 57 can be made of any materials that conducting electrical current. In some embodiments, the conductive particles 57 are made of non-conducting particles coated with a conducting layer such as a carbon, palladium, gold, copper, silver, chrome, lead, aluminum or metal oxide layer. The non-conducting particles can be made of a flexible material such as silicone rubber that is capable of being flexed or bent when compressed. The conducting layer can be coated onto the surface of the non-conducting particles by any methods known in the art.

The size or diameter of the conductive particles 57 is selected to be equal or larger than the thickness of the insulator layer 54 so that a portion of the conductive particles 57 are exposed and effectively contact with the photoconductor 48 and the first electrode 42. In one embodiment, the diameter of the conductive particles 57 is in the range of about 0.5 to 2 microns.

Interconnecting layer 37 can be prepared by dispersing conductive particles 57 with the controlled size in a solution of an insulator material. By way of example, the size of the conductive particles 57 can be controlled by, for example, using a sieving screen. The solution with conductive particles 57 is then applied onto the first electrode 42, or alternatively, onto the photoconductor 48 and then cured. The density of the conductive particles 57 in the solution is selected such that at least one conductive particle 57 contacts one pixel 42. The density of the conductive particles 57 is preferably selected so that the conductive particles 57 on adjacent pixels do not contact each other to prevent electric short. In some embodiments, curing agents or solutions may be used to facilitate curing of the interconnecting layer 37. For example, a first solution of an insulative material containing dispersed conductive particles with controlled size is prepared. A second solution containing curing agent is separately prepared. The first and second solutions are then mixed. The mixture is then coated onto the first electrode 42 or photoconductor 48. Prior to hardening of the insulative material, the first and second panels 32 and 34 are compressed to couple each other.

Figure 8:
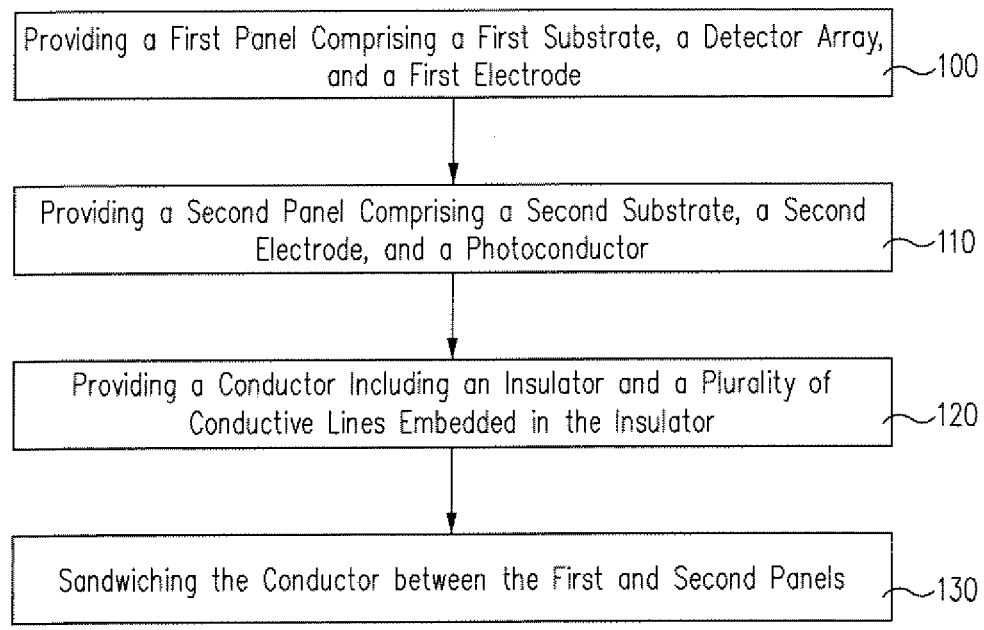
FIG. 8 is a block diagram showing a method of making an image acquisition device in accordance with an embodiment of the present invention.

FIG. 8 is a block diagram illustrating a method of making an X-ray acquisition device in accordance with an embodiment of the present invention. At step 100, a first panel is provided. The first panel includes a first substrate, a detector array atop the first substrate, and a first electrode atop the detector array. At step 110, a second panel is provided. The second panel includes a second substrate, a second electrode atop the second substrate, and a photoconductor atop the second electrode. Alternatively, the second panel includes a second substrate which also functions as a second electrode, and a photoconductor. At step 120, an interconnecting layer is provided. The interconnecting layer includes a plurality of conductors embedded in an insulator. At step 130, the interconnecting layer is sandwiched between the first and second panels.

Figure 9:
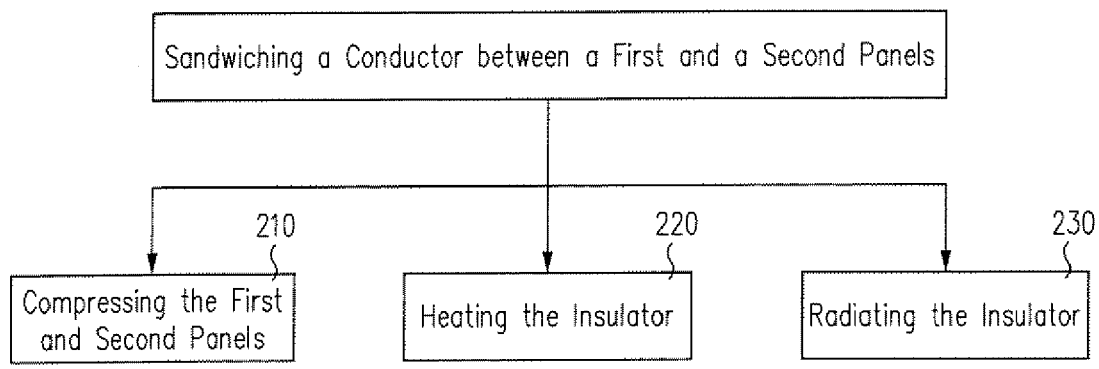
FIG. 9 is a block diagram showing a method of making an image acquisition device in accordance with another embodiment of the present invention.

FIG. 9 is a block diagram illustrating various embodiments of sandwiching an interconnecting layer between the first and second panels. In an embodiment shown at block 210, the interconnecting layer is sandwiched by compressing the first and second panels against the interconnecting layer. In such embodiment, the interconnecting layer can be made of a flexible insulator having a plurality of conductors embedded therein. For instance, the interconnecting layer can be made of a flexible silicone rubber with a plurality of conductive lines or particles embedded therein.

In another embodiment shown at block 220, the interconnecting layer is sandwiched between the first and second panels by heating. In such embodiment, the insulator can be made of a material that is thermally curable.

In an alternative embodiment shown at block 230, the interconnecting layer can be sandwiched between the first and second panels by radiation such as UV radiation.

The present invention advantageously optimizes the deposition temperature of photoconductive materials and avoids any possible delamination of the photoconductor array because of different heat expansion coefficients between the detector array and the photoconductor. The present invention also eliminates the need of a sealing barrier layer for the imager since the top surface of the imager is a substrate, which hermetically isolates the photoconductors from the environment. The photoconductor imager made according to the present invention has enhanced spatial resolution and pixel-to-pixel homogeneity.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. For example, the photoconductor can be layered structure made of the same type of photoconductor by different deposition method, or layers doped differently and using two or more layers of different semiconductors for getting better imaging parameters. Moreover, additional barrier or other interface layers can be applied on the photoconductor layer to get better electrical, mechanical and/or corrosion resistance parameters of the layer. It is intended that the scope of the invention encompass the generic area as herein disclosed, and by the claims appended hereto and their equivalents.

What is claimed is:

1. A photoconductor assembly, comprising a photoconductor layer adapted to convert an electromagnetic radiation into electrical signals and having a first surface and a second surface, and a first layer disposed on the first surface of the photoconductor layer, said first layer comprising an insulator and a plurality of conductors embedded in the insulator adapted to conduct the electrical signals.

2. The photoconductor assembly of claim 1, wherein said first layer is flexible.

3. The photoconductor assembly of claim 2 wherein the insulator is silicone rubber.

4. The photoconductor assembly of claim 1 wherein said first layer is thermal and/or radiation curable.

5. The photoconductor assembly of claim 1 wherein said conductors are in the form of elongated conductive lines.

6. The photoconductor assembly of claim 5 wherein said elongated conductive lines are spaced apart substantially in parallel.

7. The image acquisition device of claim 1 wherein the electromagnetic radiation is x-ray radiation.

8. The photoconductor assembly of claim 1 wherein said conductors are in the form of conductive particles.

9. The photoconductor assembly of claim 8 wherein said conductive particles are substantially spherical.

10. The photoconductor assembly of claim 9 wherein said conductive particles have a diameter equal or larger than a thickness of the insulator.

11. The photoconductor assembly of claim 1 wherein said insulator is made of a chemically stable material.

12. The photoconductor assembly of claim 1 wherein said first layer is adapted to transport electrical signals preferentially in one dimension.

13. An image acquisition device, comprising:
a photoconductor layer adapted to convert an electromagnetic radiation into electrical signals;
a first layer coupled to the photoconductor layer, said first layer comprising an insulator and a plurality of conductors embedded in the insulator adapted to conduct the electrical signals;
a first electrode coupled to the first layer and a second electrode coupled to the photoconductor, wherein said first and second electrodes create an electric field for transporting the electric signals via the plurality of conductors; and
a detector array adapted to detect the electric signals and coupled to said first electrode,
wherein said first layer is disposed between said photoconductor layer and said first electrode.

14. The image acquisition device of claim 13 wherein said first electrode is pixellated.

15. The image acquisition device of claim 14 wherein the density of the conductors is selected such that at least one or more conductors are in contact with each pixel.

16. The image acquisition device of claim 15 wherein the conductors are in the form of elongated conductive lines.

17. The image acquisition device of claim 16 wherein the diameter of the conductive lines is equal or smaller than a distance between two adjacent pixels.

18. The image acquisition device of claim 15 wherein the conductors are in the form of conductive spheres.

19. The image acquisition device of claim 18 wherein the diameter of the conductive spheres is equal or larger than the thickness of the insulator.

20. The image acquisition device of claim 13 wherein said insulator is made of a chemically stable material.

21. The image acquisition device of claim 13 wherein said detector array comprises an array of thin-film transistors.

22. The image acquisition device of claim 13 wherein said first layer is adapted to transport electrical signals preferentially in one dimension.

23. A method of making an image acquisition device, comprising the steps of:
   providing a first panel comprising a detector array and a first electrode;
   providing a second panel comprising a photoconductor layer and second electrode;
   providing a first layer comprising an insulator and a plurality of conductors embedded in said insulator adapted to transport electric signals; and
   sandwiching said first layer between said first and second panels such that said first layer is between said photoconductor layer and said first electrode.

24. The method of claim 23 wherein said first layer is flexible and said sandwiching step comprises compressing said first and second panels against said first layer.

25. The method of claim 23 wherein said first layer is thermally curable and said sandwiching step comprises heating the first layer.

26. The method of claim 23 wherein said first layer is radiation curable and said sandwiching step comprises radiating the first layer.

27. The method of claim 23 wherein said first electrode is pixellated, and the density of conductors in the insulator is selected such that at least one or more conductors are in contact with each pixel.

28. A photoconductor assembly, comprising:
   a photoconductor layer adapted to convert an electromagnetic radiation into electrical signals;
   a panel comprising a substrate, a detector array on the substrate, and an electrode on the detector array, said electrode being pixellated forming a plurality of pixel units, and said detector array comprising a plurality of detector elements each aligns with one of the pixel units; and
   a first layer between said photoconductor layer arid said panel, said first layer comprising an insulator and a plurality of conductors embedded in the insulator adapted to transport the electrical signals from said photoconductor to said electrode.

29. The photoconductor assembly of claim 28 wherein said first layer is adapted to transport the electrical signals preferentially in one dimension.

30. The photoconductor assembly of claim 28 wherein said detector element comprises a thin-film transistor.

31. The photoconductor assembly of claim 28 wherein said conductors are in the form of elongated conductive lines.

32. The photoconductor assembly of claim 31 wherein the diameter of said conductive lines is smaller than a distance between two adjacent pixels.

33. The photoconductor assembly of claim 28 wherein said conductors are in the form of conductive spheres.

34. The photoconductor assembly of claim 33 wherein the diameter of the conductive spheres is smaller than a distance between two adjacent pixels.

35. The photoconductor assembly of claim 28 wherein said insulator is formed of a chemically stable material.

* * * * *

UNITED STATES PATENT AND TRADEMARK OFFICE
CERTIFICATE OF CORRECTION

| | | |
|---|---|---|
| PATENT NO. | : 7,291,842 B2 | Page 1 of 1 |
| APPLICATION NO. | : 11/153017 | |
| DATED | : November 6, 2007 | |
| INVENTOR(S) | : George Zentai and Larry D. Partain | |

It is certified that error appears in the above-identified patent and that said Letters Patent is hereby corrected as shown below:

IN THE CLAIMS

Claim 28, column 10, line 14, please replace "arid" with -- and --.

Signed and Sealed this

Twenty-fourth Day of June, 2008

JON W. DUDAS
*Director of the United States Patent and Trademark Office*